(12) United States Patent
Akiyama et al.

(10) Patent No.: US 8,518,612 B2
(45) Date of Patent: Aug. 27, 2013

(54) PELLICLE FOR LITHOGRAPHY AND MANUFACTURING METHOD THEREOF

(75) Inventors: Shoji Akiyama, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 122 days.

(21) Appl. No.: 13/264,552

(22) PCT Filed: Feb. 2, 2010

(86) PCT No.: PCT/JP2010/000605
§ 371 (c)(1),
(2), (4) Date: Oct. 14, 2011

(87) PCT Pub. No.: WO2010/122697
PCT Pub. Date: Oct. 28, 2010

(65) Prior Publication Data
US 2012/0045714 A1 Feb. 23, 2012

(30) Foreign Application Priority Data
Apr. 22, 2009 (JP) ................................ 2009-103628

(51) Int. Cl.
G03F 1/64 (2012.01)
G03F 1/62 (2012.01)

(52) U.S. Cl.
USPC ............................................................ 430/5

(58) Field of Classification Search
USPC ................................................ 430/5; 428/14
See application file for complete search history.

(56) References Cited

U.S. PATENT DOCUMENTS

| | | |
|---|---|---|
| 6,180,292 B1 | 1/2001 | Acosta et al. |
| 6,623,893 B1 | 9/2003 | Levinson et al. |
| 7,372,623 B2 | 5/2008 | Banine et al. |
| 7,639,418 B2 | 12/2009 | Banine et al. |

(Continued)

FOREIGN PATENT DOCUMENTS

| | | |
|---|---|---|
| JP | 2001-28334 | 1/2001 |
| JP | 2004-524524 | 8/2004 |

(Continued)

OTHER PUBLICATIONS

Yashesh A. Shroff, et al., "EUV Pellicle Development for Mask Defect Control", Proceedings of SPIE, vol. 6151, 2006, pp. 615104-1-615104-10.

(Continued)

Primary Examiner — Stephen Rosasco
(74) Attorney, Agent, or Firm — Oblon, Spivak, McClelland, Maier & Neustadt, L.L.P.

(57) ABSTRACT

A pellicle for lithography according to the present invention comprises a pellicle film (10) of single crystal silicon, and the pellicle film (10) is supported by a support member (20) including an outer frame portion (20a) and a porous portion (mesh structure) (20b) that occupies an inner area surrounded by the outer frame portion (20a). In order to prevent oxidation of surfaces of the pellicle film 10, anti-oxidizing films 30a and 30b are provided to cover portions where the single crystal silicon film is exposed to the outside. The support member (20) can be obtained by processing a handle substrate of an SOI substrate, and the pellicle film (10) of single crystal silicon can be obtained from an SOI layer of the SOI substrate. Since the pellicle film (10) is tightly coupled to the support member (20), sufficient mechanical strength can be assured.

20 Claims, 5 Drawing Sheets

(56) References Cited

U.S. PATENT DOCUMENTS

| | | | |
|---|---|---|---|
| 7,901,846 B2 * | 3/2011 | Kubota et al. | 430/5 |
| 2004/0061930 A1 | 4/2004 | Wedowski | |
| 2005/0040345 A1 | 2/2005 | Bakker et al. | |
| 2006/0221440 A1 | 10/2006 | Banine et al. | |
| 2008/0151361 A1 | 6/2008 | Banine et al. | |
| 2008/0254211 A1 | 10/2008 | Kurt et al. | |
| 2008/0259291 A1 | 10/2008 | Banine et al. | |

FOREIGN PATENT DOCUMENTS

| | | |
|---|---|---|
| JP | 2005-43895 | 2/2005 |
| JP | 2006-279036 | 10/2006 |
| JP | 2008-268956 | 11/2008 |
| JP | 2009-282298 | 12/2009 |
| WO | WO 2008/060465 A1 | 5/2008 |

OTHER PUBLICATIONS

David F. Edwards, et al., "Handbook of Optical Constants of Solids", Academic Press, Inc., 1985, pp. 547-586.

L. Dong, et al., "Texture development mechanisms in ion beam assisted deposition", Journal of Applied Physics, vol. 84, No. 9, Nov. 1, 1998, pp. 5261-5269.

Isao Yamada, "Cluster Ion Beam—Basic and Applications", Nikkan Kogyo Shimbun Ltd., Chapter 4, Oct. 2006, pp. 127-206 (with English translation of pp. 176-179).

Office Action issued May 2, 2013, in China Patent Application No. 201080017536.4.

* cited by examiner

PELLICLE FOR LITHOGRAPHY AND MANUFACTURING METHOD THEREOF

TECHNICAL FIELD

The present invention relates to a pellicle for lithography and a manufacturing method thereof, and more specifically, to a pellicle for lithography which comprises as a pellicle film a silicon single crystal film, which is a material that is highly transmissive to extreme ultraviolet light (EUV light) and is chemically stable, and a manufacturing method thereof.

BACKGROUND ART

The development of integration and miniaturization of semiconductor devices has been accelerated over years, and patterning techniques for a line width on the order of 45 nm are currently being brought into practical use. For such fine patterning, it is known that improvements of conventional excimer exposure technologies, that is, exposure techniques such as ArF immersion or double exposure can be applied.

It is known, however, that forthcoming patterning in the next generation for a finer line width of 32 nm or smaller may no longer be feasible by means of an exposure technique with an excimer laser, and an EUV exposure technique is considered to be promising, which uses extreme ultraviolet (EUV) light with a main wavelength of 13.5 nm that is shorter than that of an excimer laser.

To bring the EUV exposure technique into practical use, it is necessary to solve technical problems with each of element technologies, such as a dust protective pellicle, for preventing contamination from being attached to a light source, a photoresist, and a photomask. Among these element technologies, there has already been a significant development in those for a light source and a photoresist. However, various problems still remain to be solved for the dust protective pellicle, which affects manufacturing yield of semiconductor devices and the like, and constitute a barrier to the practical use of the EUV exposure technique.

Specifically, unsolved technical problems with a pellicle for use in the EUV exposure include: (1) development of a material that is highly transmissive to EUV light and is chemically stable; (2) an arrangement for holding the transmissive film (pellicle film), which is necessarily a ultrathin film, under constant tension without slack; and (3) capability of being used under vacuum after the film is bonded to a photomask under normal pressure. Among these unsolved technical problems, the problem of the above item (1) is particularly serious, and in practice, material development for a transmissive film that has high transmittance to EUV light and is chemically stable without being changed due to oxidation or the like are still far from realization.

Materials that have been used for conventional pellicle films (mainly organic materials) are not transparent to the wavelength band of EUV light, and therefore they are not transmissive to EUV light. In addition, the materials have a problem of decomposition or degradation due to radiation of light. To date, no material that is fully transparent to the wavelength band of EUV light has been known; as a relatively highly transparent material, however, silicon has drawn attention and has been documented.

For example, see Shroff et al. "EUV pellicle Development for Mask Defect Control," Emerging Lithographic Technologies X, Proc of SPIE Vol. 6151 615104-1 (2006) (Document 1), and Livinson et al., U.S. Pat. No. 6,623,893 B1, "PELLICLE FOR USE IN EUV LITHOGRAPHY AND METHOD OF MAKING SUCH A PELLICLE" (Document 2).

The silicon used in a pellicle for EUV exposure reported in the Document 1, however, is a silicon film deposited by a method such as sputtering. Since such a film is necessarily amorphous, the film has high absorptivity (absorption coefficient) to light in the EUV wavelength band.

Similarly, the silicon used in a pellicle for EUV exposure reported in the Document 2 is as a premise a film deposited by a method such as CVD. In this case, since the silicon film is also amorphous or polycrystalline, the film has high absorptivity (absorption coefficient) to light in the EUV wavelength band.

Additionally, a modest tensile stress is desirable on a silicon film bonded to a frame as a pellicle film. However, since an excessive stress may cause a damage, it is desirable that, during bonding of the silicon film, the temperature should be at or a little more than the room temperature. However, in the conventional silicon films as described above, a strong stress is already introduced during deposition, such as sputtering and CVD processes.

Since these silicon films are not a single crystal silicon film, amorphous portions or grain boundaries included in the film cause absorptivity (absorption coefficient) to EUV light to increase, and therefore transmittance thereto to decrease. Moreover, these silicon films are chemically unstable and easily oxidizable. Therefore, these films are not practical because the transmittance to EUV light decreases over time.

SUMMARY OF INVENTION

Technical Problem

The present invention has been made in view of the above problems, and it is an object thereof to provide a pellicle for lithography which comprises as a pellicle film a silicon single crystal film, which is a material that is highly transmissive to extreme ultraviolet light (EUV light) and is chemically stable, and a manufacturing method thereof.

Solution to Problem

In order to solve the above problems, a pellicle for lithography according to the present invention comprises: a support member including an outer frame portion and a porous portion that occupies an inner area surrounded by the outer frame portion; and a pellicle film of single crystal silicon supported by the porous portion.

The pellicle for lithography preferably comprises an anti-oxidizing film that covers the surface of the pellicle film. Such an anti-oxidizing film consists, for example, of at least one material from a group of $SiO_x$ (including x=2), $Si_xN_y$ (including x=3, y=4), SiON, SiC, $Y_2O_3$, YN, Mo, Ru, and Rh.

The pellicle for lithography is preferably provided with a filter for transmitting a gas on a frame portion of the support member. The support member may be of silicon crystal.

A manufacturing method according to the present invention is a manufacturing method of a pellicle for lithography including a support member including an outer frame portion and a porous portion that occupies an inner area surrounded by the outer frame portion and a pellicle film of single crystal silicon supported by the porous portion, the method comprising a support member forming step of partially removing a handle substrate of a SOI substrate to form the outer frame portion and the porous portion, the handle substrate having a single crystal silicon layer provided on a surface of the handle substrate via an insulating layer.

The partial removal of a handle substrate may be carried out by dry etching with silicon deep reactive ion etching (DRIE).

The manufacturing method of a pellicle for lithography may comprise a step of removing portions of the insulating layer exposed in the porous portion after the support member forming step.

The manufacturing method of a pellicle for lithography may comprise a step of polishing the handle substrate from the back side of the handle substrate into a thin sheet of 400 μm or smaller prior to the support member forming step.

The manufacturing method of a pellicle for lithography may comprise a step of providing a reinforcing substrate prior to the support member forming step on a side on which the single crystal silicon layer is located.

The manufacturing method of a pellicle for lithography may comprise a step of forming a protective film prior to the support member forming step on a side on which the single crystal silicon layer is located.

The step of forming a protective film is preferably carried out by depositing any of a silicon oxide film ($SiO_x$), a silicon nitride film ($SiN_x$), and a silicon oxynitride film ($SiO_xN_y$).

The manufacturing method of a pellicle for lithography may comprise a step of forming an anti-oxidizing film prior to the support member forming step on a side on which the single crystal silicon layer is located.

The manufacturing method of a pellicle for lithography may comprise a step of forming an anti-oxidizing film in portions of the single crystal silicon layer exposed in the porous portion after the support member forming step.

The forming of an anti-oxidizing film is preferably carried out by depositing a film of at least one material from a group of $SiO_x$ (including x=2), $Si_xN_y$ (including x=3, y=4), SiON, SiC, $Y_2O_3$, YN, Mo, Ru, and Rh.

The deposition of the anti-oxidizing film is preferably carried out by ion beam assisted deposition or gas cluster ion beam (GCIB) deposition.

The manufacturing method of a pellicle for lithography may comprise a step of providing a filter for transmitting a gas on the outer frame portion.

Advantageous Effects of Invention

A pellicle for lithography according to the present invention comprises a support member including an outer frame portion and a porous portion that occupies an inner area surrounded by the outer frame portion and a pellicle film of single crystal silicon supported by the porous portion. Accordingly, a pellicle for lithography can be provided, which comprises as a pellicle film a silicon single crystal film, which is a material that is highly transmissive to extreme ultraviolet light (EUV light) and is chemically stable.

Further, in the manufacturing method of a pellicle for lithography according to the present invention, a support member is formed by partially removing a handle substrate of a SOI substrate, which has a single crystal silicon layer provided on a surface of the handle substrate via an insulating layer, to form the outer frame portion and the porous portion, and the single crystal silicon layer supported by the porous portion is used as a pellicle film. Accordingly, it is possible to provide a manufacturing method of a pellicle for lithography which comprises as a pellicle film a silicon single crystal film, which is a material that is highly transmissive to extreme ultraviolet light (EUV light) and is chemically stable.

DESCRIPTION OF EMBODIMENTS

Description will now be made to a pellicle for lithography according to the present invention and a manufacturing method thereof, with reference to drawings.

As described above, although silicon is a material that is relatively highly transparent to the wavelength band of EUV light, conventionally reported silicon films used in a pellicle for EUV exposure have problems of high absorptivity (absorption coefficient) of the films to light in the EUV wavelength band because they are formed by a method such as sputtering and CVD, making the films amorphous or polycrystalline. Therefore, the present inventors continuously studied a single crystal silicon film for use as a pellicle film and made the present invention.

Figure 1:
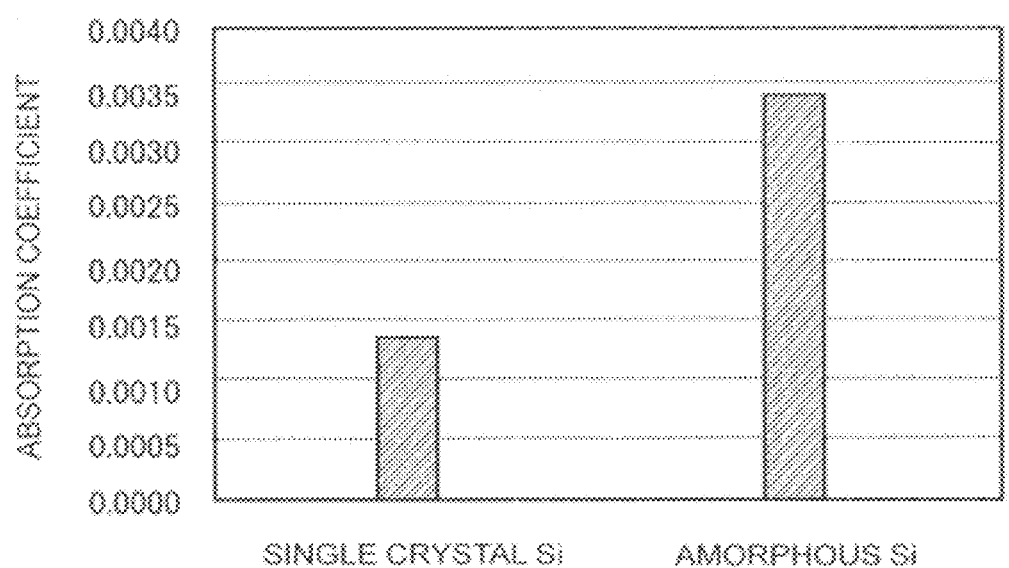
FIG. 1 is a graphical representation of comparison of an absorption coefficient of single crystal silicon film with an absorption coefficient of an amorphous silicon film to light of a wavelength of approximately 13.5 nm.

FIG. 1 is a graphical representation of an absorption coefficient of single crystal silicon film to light of a wavelength of approximately 13.5 nm compared with that of an amorphous silicon film. As shown in this figure, the single crystal silicon film has the absorption coefficient of approximately 40% of that of the amorphous silicon film, which means that it is highly transmissive to light in the EUV wavelength band, and has excellent properties as a pellicle film. For more information on absorption coefficients shown in FIG. 1, see Edward D. Palik, ed., "Handbook of Optical Constants of Solids," Academic Press, Orlando (1985) (Document 3), for example.

In order to achieve a pellicle for lithography comprising a single crystal silicon film as a pellicle film, the present inventors decided to use an SOI substrate that is provided with a single crystal silicon layer as the SOI layer thereof and continuously studied an approach of making use of the single crystal silicon layer as the pellicle film and processing an underlying substrate (handle substrate) of the SOI substrate to form a support member for the pellicle film. A pellicle obtained by such an approach has not only an advantage of being highly transmissive to light in the EUV wavelength band, but also an advantage of lack of requirement for separately forming a pellicle film and a frame for supporting the pellicle film and thereafter providing the pellicle film on the frame in a stretched manner, as in the case of conventional pellicles.

Figure 2A:
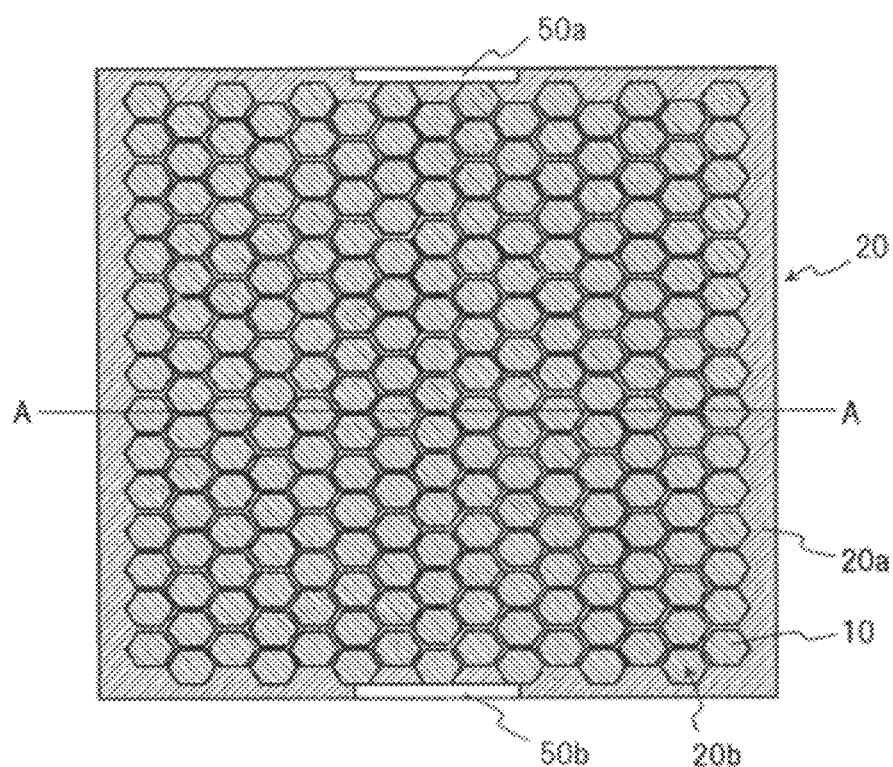
FIG. 2A is a bottom view for illustrating a structure of a pellicle for lithography according to the present invention.
Figure 2B:
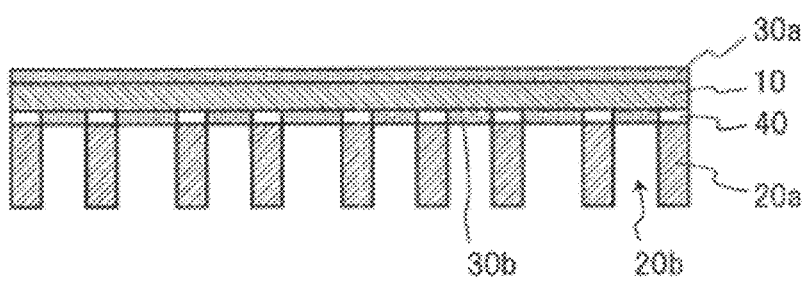
FIG. 2B is a sectional view taken along a line A-A shown in FIG. 2A.

FIGS. 2A and 2B are diagrams for illustrating a structure of a pellicle for lithography according to the present invention; FIG. 2A is a bottom view and FIG. 2B is a sectional view taken along a line A-A shown in FIG. 2A. As shown in these figures, a pellicle for lithography according to the present invention comprises a pellicle film 10 of single crystal silicon, and the pellicle film 10 is supported by a support member 20 including an outer frame portion 20a and a porous portion 20b (mesh structure) that occupies an inner area surrounded by the outer frame portion 20a.

In this example, in order to prevent oxidation of surfaces of the pellicle film 10, anti-oxidizing films 30a and 30b are provided to cover portions where the single crystal silicon film is exposed to the outside. Reference numeral 40 in the figure denotes portions that once have been an insulator layer (BOX layer) of the SOI substrate. Reference numerals 50a and 50b in the figure denote filters provided on the frame portion 20a of the support member 20, and internal pressure during the use of the pellicle can be regulated by a gas transmitting through the filters.

Figure 3:
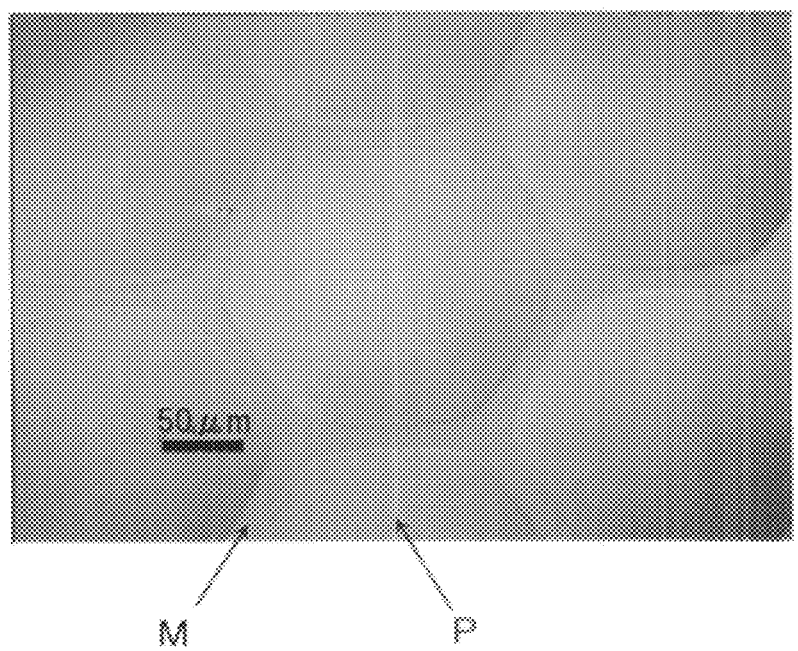
FIG. 3 is an optical microscope photograph showing an enlarged mesh structure of a pellicle for lithography according to the present invention.

FIG. 3 is an optical microscope photograph showing an enlarged mesh structure of a pellicle for lithography according to the present invention. Reference character "M" in the figure denotes a mesh structure of the support member and reference character "P" denotes a portion of pellicle film of single crystal silicon seen in an aperture of the mesh structure. In this example, a large number of apertures in a substantially hexagonal shape having a diameter of approximately 200 µm are formed in an inner area surrounded by the outer frame portion of the support member, and the spacing between the apertures is approximately 20 µm. Portions of pellicle film of single crystal silicon can be observed through the apertures, and light during exposure will be radiated through the portions onto a photomask (reticle).

In the description below, the handle substrate of the SOI substrate will be described by way of a silicon substrate; any other substrate may however be used, such as a glass substrate or a quartz substrate.

An SOI substrate for fabricating a pellicle of a configuration as described above may be an SOI substrate made up of single crystal silicon wafers, which have been crystal grown by CZ crystal growth, bonded together with an oxide film therebetween.

Such an SOI substrate may be obtained in a procedure as described below, for example. With an oxide film previously formed on a surface (bonding surface) of a first single crystal silicon substrate by means of thermal oxidation or the like, hydrogen ions are first doped into the surface of the single crystal silicon substrate to form a uniform ion doped layer to a predetermined depth (average ion doping depth L) near the surface, and the surface is further activated by means of plasma processing or the like. The first single crystal silicon substrate whose surface has been activated is then brought into close contact and bonded with a second single crystal silicon substrate, and a silicon layer is mechanically removed from the first single crystal silicon substrate with the aid of the ion doped layer. In this way, an SOI substrate that has a silicon layer (SOI layer) on the second single crystal silicon substrate is obtained.

A porous portion (mesh structure) in the inner area surrounded by the outer frame portion of the support member provided on the pellicle for lithography according to the present invention is formed because the thickness of a pellicle film of single crystal silicon of a pellicle for EUV must be thin, such as tens to hundreds of nanometers, and it is highly difficult to support such a thin pellicle film only with a pellicle frame (outer frame portion) in a stable manner while mechanical strength is secured.

In Document 1 as described above, the mesh structure is made of metal and assembled in such a way that an organic material is used as an adhesive to bond a pellicle film of amorphous silicon to the mesh structure. In such a way of assembly, however, it is difficult to bring the entire surface of the pellicle film in close contact with the mesh structure uniformly and accurately. In addition, there is a concern of organic contamination caused by the adhesive occurring when the pellicle is used under vacuum. It is also highly difficult to regulate stresses on the pellicle film.

In view of such problems, the present invention chooses to process the handle substrate of the SOI substrate into the support member. Specifically, the handle substrate is ground, polished, or otherwise thinned to a desired thickness from the back side, and the handle substrate is partially removed to form apertures that constitute a mesh structure. In such partial removal of a handle substrate, dry etching with silicon deep reactive ion etching (DRIE) widely used in MEMS and the like may be applied.

In such dry etching, the single crystal silicon layer (SOI layer), which is to be used as a pellicle film, is left unetched because the etching stops (or the etching rate decreases extremely) at an insulator layer (BOX layer) such as silicon oxide film. In addition, since the pellicle film of single crystal silicon is tightly coupled to the support member, sufficient mechanical strength can be assured. Without an adhesive, the contamination caused by residual organic materials and the like can also be avoided.

The anti-oxidizing film formed as in the aspects shown in FIGS. 2A and 2B can provide high oxidation resistance, which is required when a high power light source is used for exposure. Such an anti-oxidizing film can be obtained by forming a film of, for example, an oxidation-resistant metal such as Mo, Ru, and Rh, an inorganic material such as $SiO_x$ (including x=2), $Si_xN_y$ (including x=3, y=4), SiON, SiC, $Y_2O_3$, and YN, or at least one material from a group thereof on the surface of the single crystal silicon layer.

Although a method such as CVD, sputtering, or electron beam deposition can be used to form the anti-oxidizing film, ion beam assisted deposition or gas cluster ion beam (GCIB) deposition can provide a dense film that is of high density close to theoretical density. Therefore, since high oxidation resistance can be obtained even with a thinner anti-oxidizing film, high transmittance may not be compromised. In this respect, for example, see L. Dong et al. Journal of Applied physics, vol. 84, No. 9, pp. 5261-5269, 1998 (Document 4) and Isao Yamada, "Cluster Ion Beam—Basic and Applications," Chapter 4, Nikkan Kogyo Shimbun Ltd. (Document 5).

Further, since a pellicle is usually used under vacuum, the internal pressure needs to be regulated. A mechanism for such pressure regulation is required to be able to prevent contamination from entering when a gas passes in and out. For such a mechanism, a filter such as ULPA, which can capture fine contaminations, or a metal filter is suitable. It is also important for these filters to have such a surface area that the pellicle film may not be expanded and contracted or damaged due to non-uniform pressure difference.

Figure 4A:
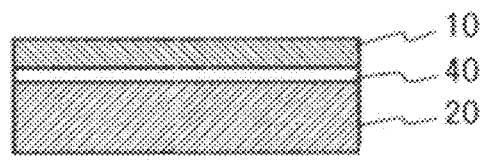
FIGS. 4A to 4G are diagrams for illustrating a first example of manufacturing method of a pellicle for lithography according to the present invention.

FIGS. 4A to 4G are diagrams for illustrating a first example of manufacturing method of a pellicle for lithography according to the present invention. First, an SOI substrate is provided (FIG. 4A). The SOI substrate has an SOI layer 10 of single crystal silicon on a handle substrate 20 via a BOX layer 40 of silicon oxide film.

In the case of 8 inch (200 mm) substrate, since the thickness is generally on the order of 700 µm, the substrate may be ground, polished, or otherwise thinned on the handle substrate side to reduce the thickness to a desired thickness (for example, 400 µm or smaller). This is because an unnecessarily tall support member may be a burden on the subsequent etching process. With the thickness previously reduced on the handle substrate side, required time for the etching process may also be reduced.

Figure 4B:
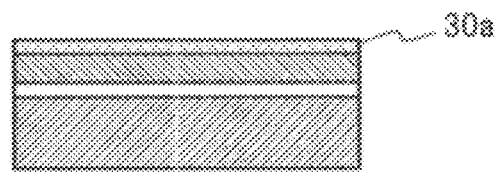
Figure 4C:
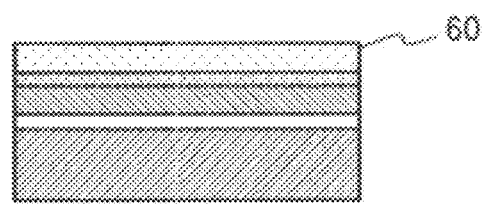
Figure 4D:
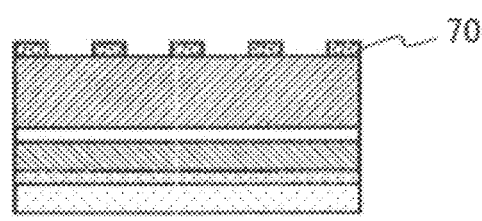
Figure 4E:
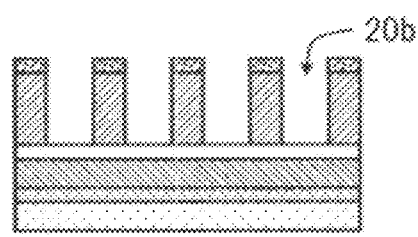

Next, an anti-oxidizing film 30a is formed on the SOI layer 10 of single crystal silicon, as necessary (FIG. 4B). A protective film 60 for protecting the SOI layer 10 may be provided on the surface where the SOI layer 10 is provided (here, on the anti-oxidizing film 30a), as necessary (FIG. 4C). An example of such a protective film includes a silicon oxide film ($SiO_x$), a silicon nitride film ($SiN_x$), and a silicon oxynitride film ($SiO_xN_y$).

Subsequently, an etching mask 70 for forming a mesh structure is formed on the handle substrate (back side) (FIG. 4D), and dry etching is performed such that uncovered areas where the etching mask 70 is absent constitute a porous portion.

Figure 4F:
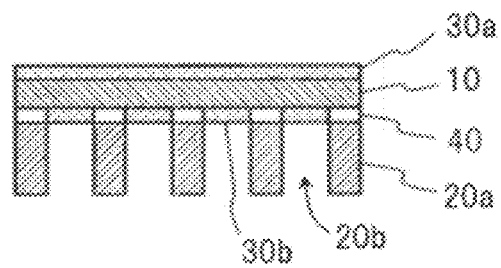
Figure 4G:
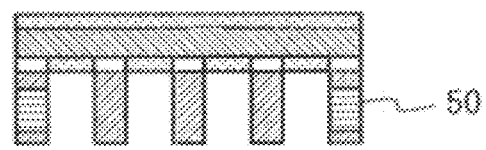

The etching mask 70 and the protective film 60 provided on the SOI layer side are then removed, and insulating layers, or the BOX layer 40, in areas exposed by the porous portion are further removed to obtain a pellicle for lithography with a pellicle film of single crystal silicon (FIG. 4F). At this time, in order to prevent oxidation of portions of the SOI layer 10 exposed by the porous portion, an anti-oxidizing film 30b may be provided. As shown in FIG. 4G, filters 50a and 50b for transmitting a gas are further provided on an outer frame portion 20a of a support member.

Figure 5A:
FIGS. 5A to 5J are diagrams for illustrating a second example of manufacturing method of a pellicle for lithography according to the present invention.
Figure 5B:
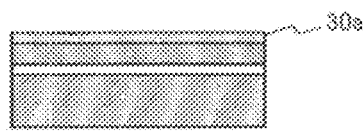
Figure 5C:
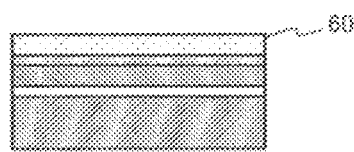
Figure 5D:
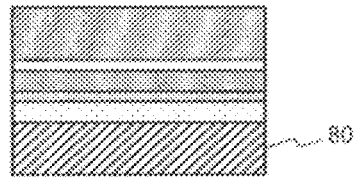
Figure 5E:
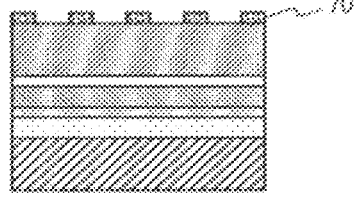
Figure 5F:
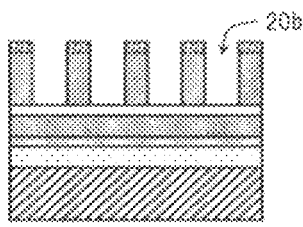
Figure 5G:
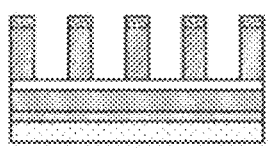
Figure 5H:
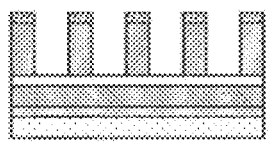
Figure 5I:
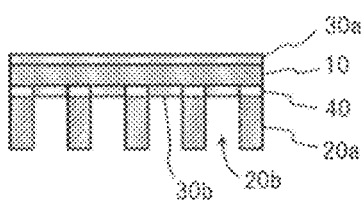
Figure 5J:
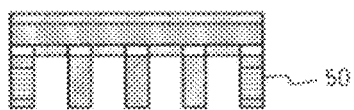

FIGS. 5A to 5J are diagrams for illustrating a second example of manufacturing method of a pellicle for lithography according to the present invention. The difference between the first example as described above and the second example is that the second example includes a step of providing a reinforcing substrate 80 on the surface where a single crystal silicon layer of the SOI substrate is provided, prior to the step of forming a support member, in order to reinforce the mechanical strength of the SOI substrate (FIG. 5D).

This is because when the handle substrate is thinned (for example, to 200 μm or smaller), the SOI substrate may be unable to support itself and may warp, and the mechanical strength can be reinforced to avoid such inconvenience. Since the reinforcing substrate 80 is provided to temporarily exert mechanical strength and is eventually removed (FIG. 5G), the material thereof is not particularly limited.

Description will now be made to examples for providing a detailed understanding of the present invention.

Example 1

An SOI substrate that was used had an SOI layer of 300 nm thick of silicon single crystal (Nearly Perfect Crystal: NPC) that has very low density of crystal defects, such as COP, bonded on a silicon substrate (handle substrate) of 200 mm diameter and 725 μm thick with a silicon thermal oxide film of 500 nm thick therebetween. After the handle substrate of the SOI substrate was ground and polished down to 300 μm, lithography was used to pattern an etching mask on the handle substrate side, DRIE was used to create a mesh structure, and HF processing was finally performed to remove an exposed silicon thermal oxide film (BOX layer) in apertures so as to finish a pellicle. In this pellicle, no damage on the pellicle film of single crystal silicon was observed.

Example 2

Similarly to Example 1, an SOI substrate that was used had an SOI layer of 300 nm thick of silicon single crystal (Nearly Perfect Crystal: NPC) that has very low density of crystal defects, such as COP, bonded on a silicon substrate (handle substrate) of 200 mm diameter and 725 μm thick with a silicon thermal oxide film of 500 nm thick therebetween. After the SOI substrate was bonded to a reinforcing substrate of Tempax glass and the handle substrate was ground and polished down to 100 μm, lithography was used to pattern an etching mask on the handle substrate side, DRIE was used to create a mesh structure, and HF processing was finally performed to remove an exposed silicon thermal oxide film (BOX layer) in apertures and the reinforcing substrate was removed so as to finish a pellicle. In this pellicle, no damage on the pellicle film of single crystal silicon was observed.

Comparative Example 1

A pellicle was finished in a similar procedure to Example 2 as described above, except that an SOI substrate that was used had an SOI layer of 100 nm thick of silicon single crystal (Nearly Perfect Crystal: NPC) that has very low density of crystal defects, such as COP, bonded on a silicon substrate (handle substrate) of 200 mm diameter and 725 μm thick with a silicon thermal oxide film of 500 nm thick therebetween. In this pellicle, some damage was observed in a part of the pellicle film, because the single crystal silicon layer of the SOI substrate that was used was as thin as 100 μm.

Example 3

Similarly to Comparative example 1, an SOI substrate that was used had an SOI layer of 100 nm thick of silicon single crystal (Nearly Perfect Crystal: NPC) that has very low density of crystal defects, such as COP, bonded on a silicon substrate (handle substrate) of 200 mm diameter and 725 μm thick with a silicon thermal oxide film of 500 nm thick therebetween. PECVD was used to deposit an oxide film to be used as a protective film to 3 μm on the SOI layer of the SOI substrate, and the protective film was thereafter bonded to a reinforcing substrate of Tempax glass.

Subsequently, after the handle substrate was ground and polished down to 100 μm, lithography was used to pattern an etching mask on the handle substrate side, DRIE was used to create a mesh structure, and HF processing was finally performed to remove an exposed silicon thermal oxide film (BOX layer) in apertures and the reinforcing substrate was removed. Further HF processing was performed to remove the protective film so as to finish a pellicle. In this pellicle, no damage on the pellicle film of single crystal silicon was observed. FIG. 3 is an optical microscope photograph showing an enlarged mesh structure of a pellicle obtained in this way. As can be seen in the photograph, a good pellicle film was obtained without any deflection on the pellicle film of single crystal silicon.

INDUSTRIAL APPLICABILITY

As described above, according to the present invention, there are provided a pellicle for lithography which comprises as a pellicle film a silicon single crystal film, which is a material that is highly transmissive to extreme ultraviolet light (EUV light) and is chemically stable, and a manufacturing method thereof.

The invention claimed is:
1. A pellicle, comprising:
 (A) a support member comprising an outer frame portion and a porous portion that occupies an inner area surrounded by the outer frame portion;

(B) a pellicle film of single crystal silicon supported by the porous portion; and
(C) an anti-oxidizing film that covers a surface of the pellicle film.

2. The pellicle of claim 1, wherein the anti-oxidizing film (C) is at least one material selected from the group consisting of $SiO_x$, $Si_xN_y$, SiON, SiC, $Y_2O_3$, YN, Mo, Ru and Rh.

3. The pellicle of claim 1, further comprising a filter (D) on the outer frame portion of the support member (A).

4. The pellicle of claim 1, wherein the support member (A) comprises silicon crystal.

5. The pellicle of claim 1, wherein the anti-oxidizing film (C) is $SiO_2$.

6. The pellicle of claim 1, wherein the anti-oxidizing film (C) is $Si_3N_4$.

7. A method of producing a pellicle, the method comprising:
    forming a support member by partially removing a handle substrate of a SOI substrate to form a outer frame portion and a porous portion,
    wherein the handle substrate comprises a single crystal silicon layer provided on a surface of the handle substrate via an insulating layer,
    wherein the pellicle produced comprises the support member comprising the outer frame portion and the porous portion that occupies an inner area surrounded by the outer frame portion and a pellicle film of single crystal silicon supported by the porous portion.

8. The method of claim 7, wherein the partially removing of the handle substrate is performed by dry etching with silicon deep reactive ion etching (DRIE).

9. The method of claim 7, further comprising, after the forming of the support member:
    removing a portion of the insulating layer exposed in the porous portion.

10. The method of claim 7, further comprising, prior to the forming of the support member:
    polishing the handle substrate from a back side of the handle substrate into a thin sheet of 400 μm or smaller.

11. The method of claim 7, further comprising, prior to the forming of the support member:
    providing a reinforcing substrate on a side on which the single crystal silicon layer is located.

12. The method of claim 7, further comprising, prior to the forming of the support member:
    forming a protective film on a side on which the single crystal silicon layer is located.

13. The method of claim 12, wherein the forming the protective film is performed by depositing any of a silicon oxide film ($SiO_x$), a silicon nitride film ($SiN_x$) and a silicon oxynitride film ($SiO_xN_y$).

14. The method of claim 7, further comprising, prior to the forming of the support member:
    forming an anti-oxidizing film on a side on which the single crystal silicon layer is located.

15. The method of claim 14, wherein the forming of the anti-oxidizing film is performed by depositing a film of at least one material from a group of $SiO_x$, $Si_xN_y$, SiON, SiC, $Y_2O_3$, YN, Mo, Ru and Rh.

16. The method of claim 15, wherein the forming of the anti-oxidizing film is performed by ion beam assisted deposition or gas cluster ion beam (GCIB) deposition.

17. The method of claim 7, further comprising, after the forming of the support member:
    forming an anti-oxidizing film in a portion of the single crystal silicon layer exposed in the porous portion.

18. The method of claim 17, wherein the forming of the anti-oxidizing film is performed by depositing a film of at least one material selected from the group consisting of $SiO_x$, $Si_xN_y$, SiON, SiC, $Y_2O_3$, YN, Mo, Ru and Rh.

19. The method of claim 18, wherein the forming of the anti-oxidizing film is performed by ion beam assisted deposition or gas cluster ion beam (GCIB) deposition.

20. The method of claim 7, further comprising:
    providing a filter on the outer frame portion.

* * * * *